(12) United States Patent
Hatta et al.

(10) Patent No.: US 7,396,409 B2
(45) Date of Patent: Jul. 8, 2008

(54) ACICULAR SILICON CRYSTAL AND PROCESS FOR PRODUCING THE SAME

(75) Inventors: Akitmitsu Hatta, Nankoku (JP); Hiroaki Yoshimura, Nankoku (JP); Keiichi Ishimoto, Kochi (JP); Hiroaki Kanakusa, Kochi (JP); Shinichi Kawagoe, Nankoku (JP)

(73) Assignees: Covalent Materials Corporation, Tokyo (JP); Techno Network Shikoku Co., Ltd., Takamatsu-shi (JP)

( * ) Notice: Subject to any disclaimer, the term of this patent is extended or adjusted under 35 U.S.C. 154(b) by 244 days.

(21) Appl. No.: 10/526,486

(22) PCT Filed: Sep. 4, 2003

(86) PCT No.: PCT/JP03/11317

§ 371 (c)(1),
(2), (4) Date: Mar. 4, 2005

(87) PCT Pub. No.: WO2004/027127

PCT Pub. Date: Apr. 1, 2004

(65) Prior Publication Data

US 2005/0244324 A1    Nov. 3, 2005

(30) Foreign Application Priority Data

Sep. 19, 2002 (JP) .............................. 2002-272473
Nov. 28, 2002 (JP) .............................. 2002-345192
Jan. 16, 2003 (JP) .............................. 2003-007772

(51) Int. Cl.
*C01B 33/02* (2006.01)

(52) U.S. Cl. .............................. 117/84; 117/88; 117/90; 117/92; 117/94; 117/95; 117/103; 117/903

(58) Field of Classification Search .................. 117/84, 117/88, 90, 92, 94, 95, 103, 903
See application file for complete search history.

(56) References Cited

U.S. PATENT DOCUMENTS 5,383,354 A * 1/1995 Doris et al. .................... 73/105

(Continued)

FOREIGN PATENT DOCUMENTS

DE      691 04 864 T2    3/1995

(Continued)

OTHER PUBLICATIONS

Chen et al. "Field emission of different oriented carbon nanotubes", Applied Physics letters vol. 76, No. 17, p. 2469-2471 (2000).*

(Continued)

*Primary Examiner*—Robert Kunemund
*Assistant Examiner*—Matthew J Song
(74) *Attorney, Agent, or Firm*—Foley & Lardner LLP

(57) ABSTRACT

By uniformly forming an indefinite number of microscopic acicular crystals on a surface of a silicon substrate so as to be perpendicular to the surface of the substrate by plasma CVD method using a catalyst, it is possible to reliably, homogeneously and massively form an ultramicroscopic acicular silicon crystal having a substantial cone shape tapered so as to have a radius of curvature of not less than 1 nm to no more than 20 nm at its tip end and having a diameter of bottom surface of not less than 10 nm, and a height equivalent to or more than the diameter of bottom surface, at a desired location.

3 Claims, 4 Drawing Sheets

U.S. PATENT DOCUMENTS

| | | | |
|---|---|---|---|
| 5,976,957 A | 11/1999 | Westwater et al. | |
| 6,027,951 A * | 2/2000 | MacDonald et al. | 438/20 |
| 6,221,154 B1 * | 4/2001 | Lee et al. | 117/87 |
| 2002/0129761 A1 | 9/2002 | Takami | |
| 2002/0163079 A1 * | 11/2002 | Awano | 257/750 |
| 2004/0079962 A1 * | 4/2004 | Kanechika et al. | 257/163 |

FOREIGN PATENT DOCUMENTS

| | | |
|---|---|---|
| DE | 697 29 158 T2 | 5/2005 |
| EP | 1 102 298 A1 | 5/2001 |
| JP | 05-095121 A | 4/1993 |
| JP | 2000-109308 A | 4/2000 |
| JP | 2001-048512 A | 2/2001 |
| JP | 2002-220300 A | 8/2002 |
| JP | 2003-246700 A | 9/2003 |
| WO | WO 03/088361 A1 | 10/2003 |

OTHER PUBLICATIONS

Yan et al. "Growth of amorphous silicon nanowires via a solid-liquid-solid mechanism", Chemical Physics Letters 323 (2000), p. 224-228.*

Yu et al., "Controlled growth of oriented amorphous silicon nanowires via a solid-liquid-solid (SLS) mechanism", Physica E 9 (2001) p. 305-309.*

* cited by examiner

ACICULAR SILICON CRYSTAL AND PROCESS FOR PRODUCING THE SAME

TECHNICAL FIELD

The present invention relates to acicular silicon crystals and methods for producing thereof, and more specifically, to a nano-sized silicon acicular crystal having a sharp-pointed shape which is useful in nanotechnology, and to a method enabling mass formation of the acicular silicon crystal on a silicon substrate.

BACKGROUND ART

With the recent sophistication in technologies of electronics industries, demands for more miniaturized and integrated devices are increasing. The miniaturization degree in the process technologies have now exceeded the ranges of sub micrometers to reach the order of nanometer(nm). For this reason, devices or components of several tens of nanometers to several nanometers in size are required.

As a microscopic material for producing such components or devices, a carbon nano tube discovered in 1991 is attracting the attention.

Moreover, in recent years, other than the carbon nano tube, ultramicroscopic carbon materials having various shapes such as carbon nano cone, carbon nano wire, carbon nano sheet, carbon nano belt and the like have been proposed or manufactured, and are under research and development for practical application.

As to the carbon material having a graphite structure as described above, there are known a number of synthesis examples for ultramicroscopic structure having a sharp-pointed shape such as carbon nano tube or carbon nano cone having an elongated cone shape.

Generally, as the size of a substance reduces to the order of nanometer, the substance will exhibit a new attribute which is completely different from that when the substance is bulk. For example, a carbon nano tube exhibits an attribute of semiconductor depending on the size or structure, while the bulk graphite is an electric conductor.

When an electric field is applied to a tip end of a nano tube, intense field concentration occurs, and electrons will easily fly into a vacuum from the tip end of the tube due to the tunnel effect.

Because of these properties, the above-mentioned ultramicroscopic carbon materials also attract attention from the view of using as an electronics member.

In production of the above-mentioned ultramicroscopic carbon materials, for example, in order to produce a carbon nano tube, arc discharge from graphite electrode, thermal decomposition of hydrocarbon in gas phase, sublimation of graphite by means of laser and the like approaches have been conventionally used.

In recent years, for example, Japanese Patent Application Laid-Open No. 2000-109308 proposed a method for forming a carbon nano tube film (film formed of a plurality of carbon nano tubes having certain orientation) by applying silicon carbide crystals on a substrate of silicon single crystal by epitaxial growth, followed by etching, heating at high temperatures and the like processes.

Furthermore, Japanese Patent Application Laid-Open No. 2001-48512 discloses a method in which carbon nano tubes are produced directly on a surface of a metal substrate by way of plasma CVD method so as to orient vertically.

Regarding the production or processing method of such ultramicroscopic members or structures, the following two basic concepts are known.

One concept lies in a so-called bottom-up method, wherein using a microscopic substance comprising a molecule, an atom, or a functional group having as same size as molecule or atom, an ion and the like as a material, and the microscopic substance is built up into a desired structure by way of synthesis, modification, transfer, replacement, desorption, migration and the like.

The other concept lies in a so-called top-down method, wherein a macroscopic material (bulk) is processed for size reduction to an ultramicroscopic size region by cutting, milling, decomposing, etching, dissolution and the like.

In the case of carbon nano structures, especially ultramicroscopic structures having a sharp-pointed shape such as carbon nano tube or carbon nano cone as described above, it is practically very difficult to conduct micromachining in the scale of submicrometer or smaller according to the latter method, so that such carbon nano structures are in most cases produced by the bottom-up method.

Besides carbon nano structures, nano cone structures formed of boron nitride (BN), multilayered acicular crystal structures of gallium arsenide (GaAs)/aluminum gallium arsenide (AlGaAs) are also produced in the manner as described above (see Japanese Patent Application Laid-Open No.5-95121).

With regard to silicon (Si), although it is an element belonging to the same group with carbon, synthesis examples for similar nano structures are little known.

Few known cases are at most that a fibrous silicon crystal is incidentally formed by a VLS mechanism (vapor-liquid-solid mechanism) in crystal growth of silicon, and that a fibrous crystal having a stalk-like shape is formed by surface segregation by placing Si microcrystalline particles as seed crystals on a silicon (Si) substrate and heating the surface of the substrate to around the melting point of Si (for example, Japanese Patent Application Laid-Open No. 2002-220300).

On the other hand, regarding the method for sharpening a tip end of a silicon material, a method in which micromachining is conducted by etching is known. However, sharpening the tip end to a nano size by etching is relatively difficult.

One reason for the difficulty in production of a sharp-pointed silicon microscopic structure such as silicon nano tube and silicon nano cone through synthesis is that silicon is easily oxidized in air to change to silicon oxides.

In particular, an ultramicroscopic structure such as nano structure has a very large specific surface area, so that it is susceptible to oxidation and easily oxidized to collide by contact with a trace of oxygen and oxidative substances. A tip end in particular is extremely sensitive to oxidization to readily induce collision of the structure, because the tip end is large in bending torsion compared to the body portion and the like.

Therefore, it was conventionally difficult to produce a nano-sized acicular silicon crystal having a sharp-pointed shape massively and reliably using any of the aforementioned methods.

As a result of diligent studies for solving the above technical problems, inventors of the present invention finally succeeded in forming an ultramicroscopic silicon acicular crystal having a sharp-pointed shape in the course of subjecting a silicon substrate to plasma CVD treatment under a specific condition. Based on this finding, we accomplished the present invention.

It is an object of the present invention to provide an ultramicroscopic acicular silicon crystal having a sharp-pointed shape which is similar to a carbon nano tube or an elongated conical carbon nano cone.

It is also an object of the present invention to provide a method enabling the acicular silicon crystal to be reliably, homogenously and massively formed at a desired location.

DISCLOSURE OF THE INVENTION

An acicular silicon crystal according to the present invention is tapered so that a radius of curvature at its tip end is not less than 1 nm to no more than 20 nm, and is a substantial cone having a diameter of bottom surface of not less than 10 nm, and a height equivalent to or more than the diameter of bottom surface.

Herein, the wordings "substantially conical", refers to not only a perfect circular conical shape, but includes other conical shapes having a cross section shape of ellipse, approximate polygons such as triangle and quadrangle, as well as those having a conical upper part and a columnar lower part.

A nano-sized ultramicroscopic acicular silicon crystal having a sharp-pointed shape have various applications in nanotechnology including tweezers, probe, sensor, semiconductor device, electron emission device and the like.

Preferably, the aforementioned acicular silicon crystal has a diameter of bottom surface of not less than 10 nm to no more than 50000 nm, and the height is not less than 10 nm to no more than 200000 nm.

These ranges of size define preferred ranges taking practicability and production easiness into consideration.

The aforementioned acicular silicon crystal is formed perpendicularly to the surface of the substrate.

Therefore, it can have a right conical structure while keeping the sharp-pointed shape.

Additionally, a surface of the above acicular silicon crystal may be coated with a thin carbon film.

As a result, inside silicon coated with the thin carbon film is prevented from being oxidized, so that the acicular silicon crystal is able to exist in stable condition.

A production method for an acicular silicon crystal according to the present invention comprises uniformly forming an indefinite large number of microscopic acicular crystals on a surface of a silicon surface by plasma CVD method using a catalyst, in such a manner that they are oriented perpendicularly to the substrate.

According to the above method, it is possible to homogenously and massively form an ultramicroscopic acicular silicon crystal having a sharp-pointed shape and exhibiting a constant orientation at a desired location.

In the aforementioned plasma CVD method, it is preferable that after uniformly adhering the catalytic micrometal particles on the surface of the silicon substrate, discharge plasma is generated by microwave power while supplying a hydrocarbon-based gas and a carrier gas, thereby forming on the surface of the silicon substrate acicular crystals whose surfaces are coated with a thin carbon film.

According to the above production method, by using metal microparticles as a catalyst and supplying a hydrocarbon-based gas and a carrier gas, an indefinite number of microscopic acicular crystals almost corresponding to the catalytic metal microparticles adhered on the surface of the silicon substrate can be obtained in stable condition.

In the above production method, by using as the silicon substrate, an n-type low resistive silicon substrate doped with antimony (Sb), arsenic (As), phosphorus (P) or the like, it is possible to obtain the acicular silicon crystals more effectively.

BEST MODE FOR CARRYING OUT THE INVENTION

The present invention will be now explained more detail partly with reference to the attached drawings.

Figure 1:
FIG. 1 is an electron microscopic picture of an acicular silicon crystal according to the present invention.

FIG. 1 is an electron microscopic picture of an acicular silicon crystal according to the present invention.

As shown in FIG. 1, an acicular silicon crystal 1 according to the present invention is tapered to have a radius of curvature of nano order at its tip end, and has a vertically long, substantially conical shape in which a ratio of height to diameter of bottom surface is not less than one.

In the present invention, it is possible to produce a separate nano-sized silicon crystal.

The tip end is like a sharp-pointed acicular having a radius of curvature of not less than 1 nm to no more than 20 nm, and more preferably of not less than 1 nm to no more than 5 nm.

The acicular silicon crystal 1 forms a substantial cone having a diameter of bottom surface of not less than 10 nm to no more than 50000 nm, more preferably of not less than 50 nm to no more than 1000 nm, and a height of not less than 10 nm to no more than 200000 nm, more preferably of not less than 50 nm to no more than 4000 nm.

Other acicular silicon crystals satisfying other ranges than the above may be produced, however, those satisfying the above size ranges are preferred considering the practicability and production ease.

Further, the acicular silicon crystal shown in FIG. 1, has a surface coated with a thin carbon film.

Nano-sized silicon is easily oxidized in air, however, by coating it with the thin carbon film, oxidization of the inside silicon is avoided, and the silicon can exist in stable condition.

Preferably, the thin carbon film is about 0.3 to 3 nm in thickness for both a single-molecular layer and a multi-molecular layer.

The thin carbon film that coats the acicular silicon crystal surface can be readily removed as necessary.

For example, after the thin carbon film (C) is reacted with silicon (Si) by heating, thereby forming a silicon carbide (SiC) layer, the silicon carbide layer is removed by an etching using an etching liquid such as $HF+HNO_3$ and thus only inside silicon crystals can be isolated.

If necessary for a specific application, acicular silicon single crystals may be used in the condition that they are coated with a silicon carbide layer.

Figure 2:
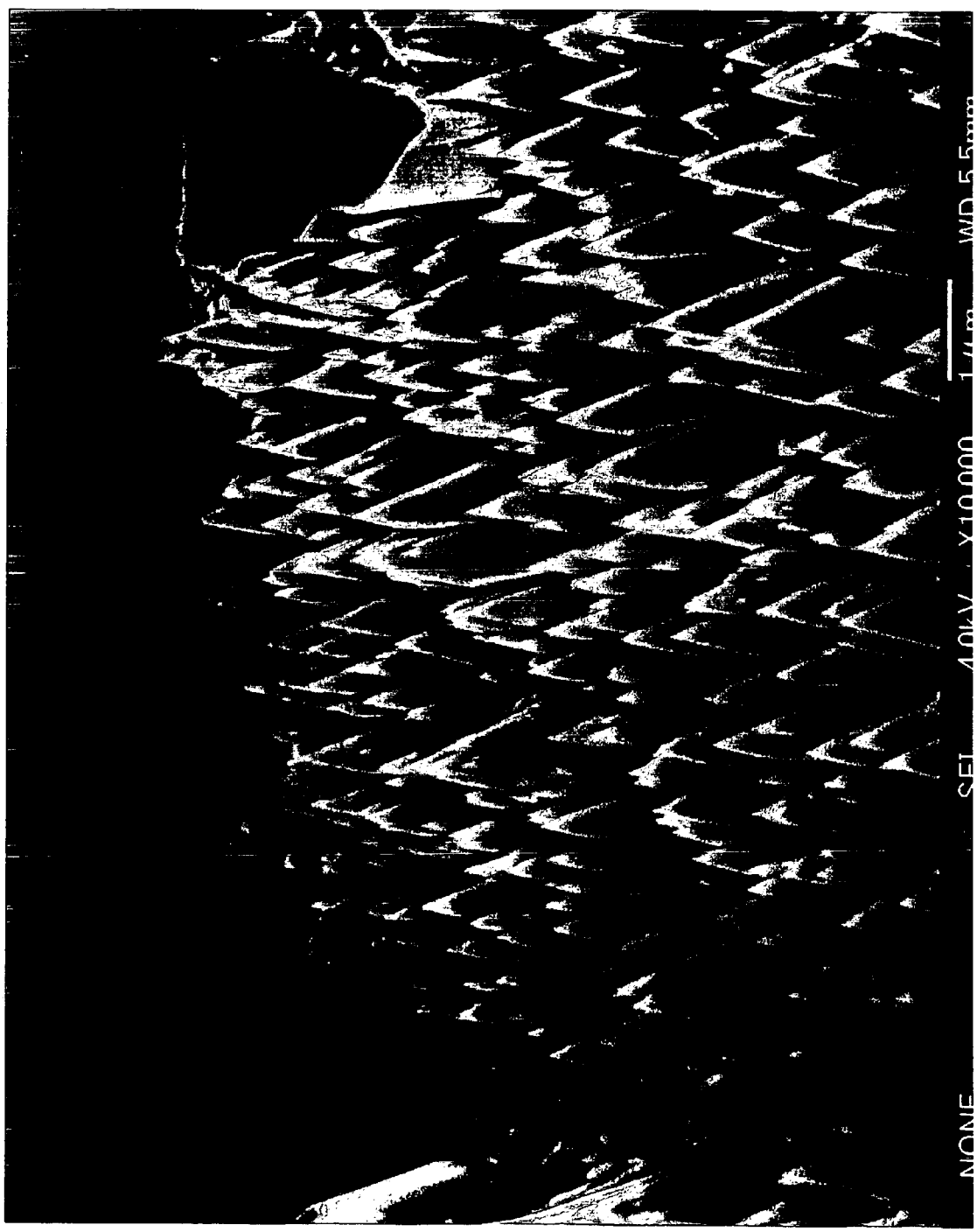
FIG. 2 is an electron microscopic picture of a group of acicular silicon crystals formed on a silicon substrate according to the present invention.

FIG. 2 is an electron microscopic picture of a group of acicular silicon crystals described above formed on the surface of the silicon substrate by the production method according to the present invention.

As shown in FIG. 2, according to the production method of the present invention, the acicular silicon crystals according to the present invention can be formed as an indefinite number of homogeneous microscopic acicular crystals of the same size, which are oriented uniformly and perpendicularly to the surface of the silicon substrate.

Therefore, the group of acicular silicon crystals shown in FIG. 2 is observed as a cluster of an indefinite number of substantial circles in the electron microscopic picture viewed from above.

In an end edge of the silicon substrate bearing the crystal group, acicular crystals formed in oblique directions from the substrate surface are also observed. This would reflect the direction of electric field in the vicinity of the substrate surface during formation of the crystals.

The acicular silicon crystal as shown in FIG. 1 has a filed electron emission characteristic which is as excellent as that of a polycrystalline diamond thin film.

Figure 5:
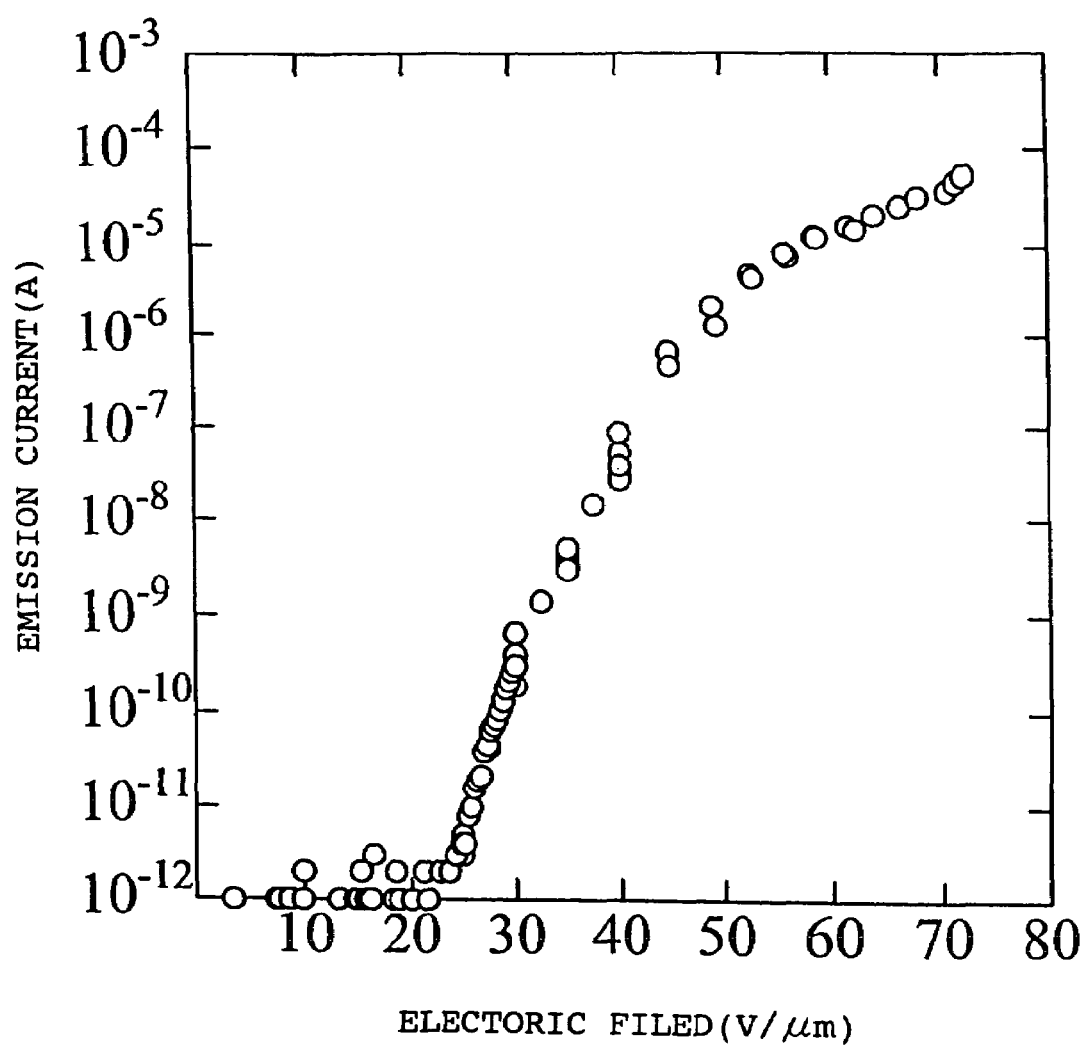
FIG. 5 is a graph showing measurements of field electron emission characteristic of an acicular silicon crystal according to the present invention.

Actually, as shown in Example 2 below, filed electron emission was examined by locating an acicular electrode made of tungsten at 10 μm above the tip end of the acicular silicon crystal, and applying a voltage of up to 1000 V in vacuum. Electron emission was observed when about 25V/μm or more electric field was applied as shown in the graph of FIG. 5.

Having such a field electron emission characteristic, the acicular silicon crystal according to the present invention is applicable as an electron emission material and is expected for application to, for example, a filed emission display.

Next, a production method for acicular silicon crystal according to the present invention will be explained.

In the present invention, an indefinite number of microscopic acicular silicon crystals are formed uniformly on a surface of a silicon substrate so as to orient perpendicularly to the substrate surface by plasma CVD method using a catalyst.

The plasma CVD method is preferably implemented by a bias plasma CVD which combines sputtering of catalyst and plasma CVD by microwave power, and by such a method, it is possible to form silicon crystals in acicular forms rather than in a film form.

Therefore, according to the production method of the present invention, it is possible to form an ultramicroscopic acicular silicon crystal having a sharp-pointed form and exhibiting a constant orientation, uniformly on a massive scale at a desired location.

Figure 3:
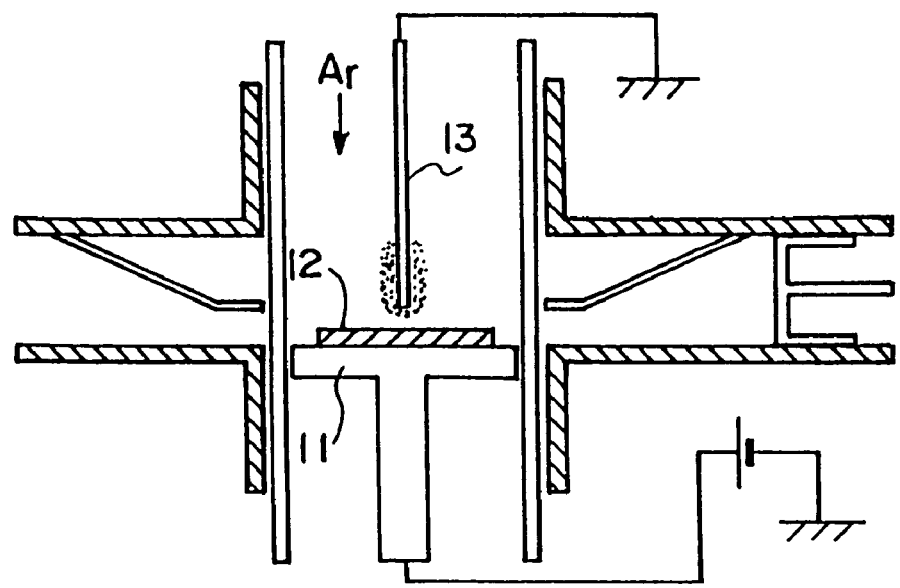
FIG. 3 is a schematic section view showing a direct-current sputtering step in which a catalytic metal (iron wire) is used as an electrode in the production method according to the present invention.
Figure 4:
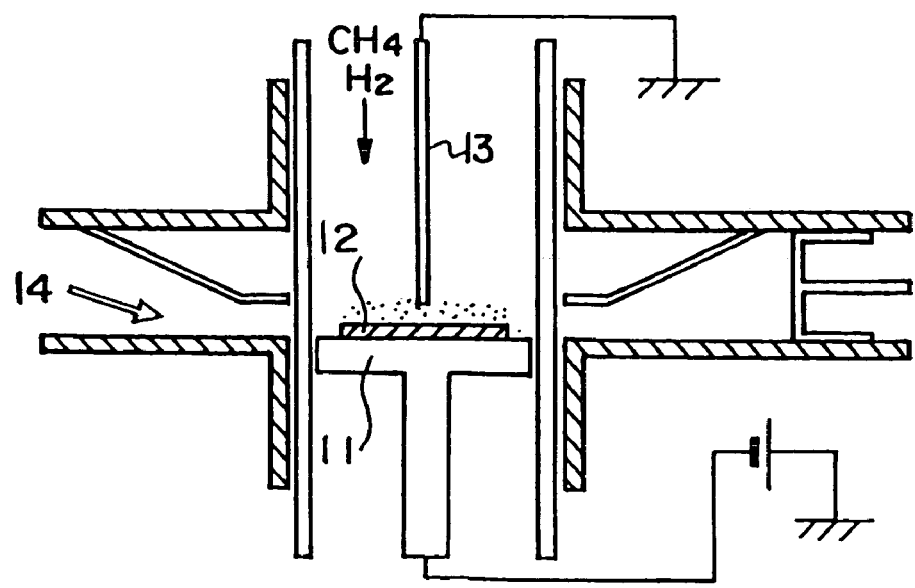
FIG. 4 is a schematic section view showing a plasma CVD step in which microwave and negative bias is applied in the production method according to the present invention.

Regarding the above production method, concrete production steps will be exemplarily shown with reference to FIGS. 3 and 4.

First, a silicon substrate 12 is placed on a substrate holder 11 of a microwave plasma CVD apparatus as shown in FIG. 3, and then a direct-current voltage is applied under reduced pressure while the silicon substrate 12, a target of anode side and a catalyst metal 13, a target of cathode side are opposed to each other in an atmosphere of inert gas such as argon (Ar), thereby sputtering microparticles of the catalytic metal.

This sputtering is preferably continued for about several minutes to 30 minutes under reduced pressure of about 80 to 150 Pa, and this enables the microparticles of the catalytic metal to adhere uniformly on the surface of the silicon substrate.

Next, as shown in FIG. 4, electron discharge plasma is generated by a microwave power 14 and a negative bias is applied on the silicon substrate 12 while supplying a hydro-carbon-based gas such as methane ($CH_4$) gas and a carrier gas such as hydrogen ($H_2$) gas on the surface of the silicon substrate on which the microparticles of the catalytic metal adhered.

As a result, an in definite number of acicular silicon crystals almost corresponding to the microparticles of the catalytic metal adhered on the surface of the silicon substrate are formed.

According to the above production method, by using metal microparticles as a catalyst and supplying a hydrocarbon-based gas and a carrier gas, it is possible to obtain acicular silicon crystals in such stable condition that the surfaces thereof are coated with a thin carbon film.

The thin carbon film on the surfaces maybe readily removed, and may alternatively be a silicon carbide thin film.

As a catalytic metal in the above production method, Fe, Ni, Co, Cu and the like, as well as combinations of two or more of them can be used, and among these Fe is especially preferred.

The temperature condition for the plasma CVD method is about 250 to 800° C., preferably about 400° C. of silicon substrate temperature.

As to the pressure, a reduced pressure condition of about 240 to 13300 Pa is preferred.

As the hydrocarbon-based gas used in the above plasma CVD method, for example, methane, ethane, ethylene, acetylene, propane, propylene and the like lower hydrocarbons can be recited, and among these, methane is preferably used.

As the carrier gas, hydrogen ($H_2$) and/or helium (He), argon (Ar), neon (Ne), krypton (Kr), xenon (Xe) and the like inert gases, or mixed gases of these inert gases and hydrogen and the like can be used.

As the silicon substrate used in the present invention, a silicon single crystal wafer having subjected to surface cleaning treatment after mirror polishing is preferably used without particular limitation, and an n-type low resistive silicon wafer doped with antimony (Sb), arsenic (As), phosphorus (P) or the like and having resistivity of about 0.1 to 20 Ω·cm is especially preferred.

Those having crystal orientation of <100> on the surface of the silicon substrate and having subjected to surface oxidization treatment are more preferably used.

The acicular silicon crystal obtained in the manner as described above is a substance which is expected for various applications in nanotechnology.

For example, in handling nano-sized substances in the SEM (scanning electron microscope), TEM (transmission electron microscope), AFM (atomic force microscopic) and the like, an acicular, a pair of tweezers, a probe or the like having a nano-sized tip end is required. The acicular silicon crystal according to the present invention can be favorably used for such application because of its shape.

It is also favorably used as a sensor for analyzing a nano-sized substance, and is useful in biotechnology, especially in detection of genes.

Furthermore, since the acicular crystal according to the present invention is formed of a silicon single crystal, the tip end thereof can be used as a nano-sized semiconductor sensor or semiconductor device when doped with a trace amount of impurity.

Since intense concentration of electric field occurs in an electric conductor or semiconductor having a sharp-pointed shape, electrons in the solid are easily emitted into a vacuum due to the tunnel effect. Using this principle, application as a material for a device that emits electrons such as cold cathode is also possible. Examples of such application include a field emission display (FED) that combines advantages of a cathode-ray tube display (CRT) and a liquid crystal display (LCD), in the field of displays where thinning and flattening are advanced.

In the following, the present invention will be explained concretely based on Examples, however, the present invention is not limited to the following Examples.

EXAMPLE 1

Using a clean <100> silicon wafer (low-resistive n-type) of 15 mm×15 mm in size as a silicon substrate, iron serving as a catalytic metal was sputtered for 20 minutes by direct-current electron emission plasma using argon gas, after the pressure was reduced to 120 Pa by means of the apparatus as shown in FIG. 3. Thus iron microparticles were uniformly adhered on the substrate surface.

Using these iron microparticles as a catalyst, a negative bias voltage of 200 V was applied to the silicon substrate for about one hour in the condition that electron emission plasma was generated by a microwave power of 400 W at a substrate temperature of about 400° C. and pressure of 240 Pa and methane (20%)/hydrogen mixed gas was supplied, by means of the apparatus as shown in FIG. 4.

Macroscopic observation of the resultant silicon substrate sample having subjected to the plasma CVD treatment showed that the surface of the substrate was coated with a black thin film.

Furthermore, electron microscopic observation of the substrate sample showed that an indefinite number of acicular-like substances of substantially cone shape were oriented uniformly and perpendicularly to the surface of the substrate. At an end of the substrate, acicular substances formed in oblique directions were also observed.

It was found that each of the above acicular-like substances was tapered so that the tip end thereof has a radius of curvature of no more than 10 nm and was substantially conical having a diameter of bottom surface of not less than 100 nm to no more than 200 nm, and a height of not less than 1000 nm to no more than 2000 nm.

Electron energy loss spectrometric (EELS) measurement revealed that the acicular-like substance was a silicon crystal whose entire surface was coated with a thin carbon film.

EXAMPLE 2

An acicular electrode made of tungsten having a tip end diameter of 50 μm was placed 10 μm above the tip end of the acicular silicon crystal obtained in Example 1, and field electron emission was measured in substantially vacuum condition ($10^{-8}$ Pa) while varying the applied voltage from 0 to 1000V.

The results are shown in FIG. 5.

In the graph shown in FIG. 5, the vertical axis represents emission current (A) and the horizontal axis represents applied electric field (V/μm).

As a result of the above measurement, emission current of more than several pA (pico amperes) was observed at an applied field of more than about 25 V/μm, as shown in the graph of FIG. 5. In other words, electron emission was observed.

INDUSTRIAL APPLICABILITY

As described above, since the acicular silicon crystal according to the present invention is a nano-sized ultramicroscopic acicular silicon crystal having a sharp-pointed shape, various applications in nanotechnology including tweezers, probe and the like, or biosensor used in a gene test or the like, semiconductor sensor, semiconductor device, electron emission device, field emission display and the like are expected.

According to the production method for the a cicular silicon crystal of the present invention, it is possible to produce the acicular silicon crystal reliably and homogenously at a desired location on a massive scale, so that mass production of silicon ultramicroscopic structure having a sharp-pointed shape may be facilitated.

The invention claimed is:

1. A method for producing an acicular silicon crystal which comprises:
   sputtering catalytic metal micro particles by applying a direct-current voltage to a silicon substrate under reduced pressure with the silicon substrate, a target of anode side and a catalyst metal, a target of cathode side opposed to each other in an atmosphere of inert gas to uniformly adhere the catalytic metal micro particles on the silicon substrate;
   and then generating electron discharge plasma by a microwave power during supplying a hydrocarbon-based gas and a carrier gas on the silicon substrate to form acicular silicon crystals with surfaces coated with a thin carbon film.

2. The method for producing an acicular silicon crystal according to claim 1, wherein the catalytic metal micro particles comprise Fe.

3. The method for producing an acicular silicon crystal according to claim 1, wherein an n-type low resistive silicon substrate having resistivity of 0.1 to 20 Ω·cm is used as the silicon substrate.

* * * * *